(12) United States Patent
Park

(10) Patent No.: US 6,859,743 B2
(45) Date of Patent: Feb. 22, 2005

(54) METHOD FOR DETERMINING AN EFFECTIVE VOLTAGE OF A BATTERY

(75) Inventor: Sun-Soon Park, Hwaseong (KR)

(73) Assignee: Hyundai Motor Company, Seoul (KR)

( * ) Notice: Subject to any disclaimer, the term of this patent is extended or adjusted under 35 U.S.C. 154(b) by 146 days.

(21) Appl. No.: 10/306,521

(22) Filed: Nov. 27, 2002

(65) Prior Publication Data

US 2003/0171881 A1 Sep. 11, 2003

(30) Foreign Application Priority Data

Mar. 6, 2002 (KR) .................................. 10-2002-0011926

(51) Int. Cl.$^7$ .............................. G06F 19/00; H02J 7/00
(52) U.S. Cl. .......................... 702/63; 320/137; 320/136
(58) Field of Search .......................... 702/63; 324/600; 320/134, 136, 155, 156, 161

(56) References Cited

U.S. PATENT DOCUMENTS

| | | | | |
|---|---|---|---|---|
| 5,808,443 A | * | 9/1998 | Lundstrom | ................... 320/164 |
| 6,100,668 A | * | 8/2000 | Takano | ........................ 320/148 |
| 6,377,028 B1 | * | 4/2002 | Armstrong et al. | .......... 320/136 |
| 6,377,030 B1 | * | 4/2002 | Asao et al. | .................. 320/161 |
| 6,411,911 B1 | * | 6/2002 | Hirsch et al. | ................... 702/63 |
| 6,621,271 B2 | * | 9/2003 | Ziegler | ....................... 324/426 |
| 6,639,385 B2 | * | 10/2003 | Verbrugge et al. | ........... 320/132 |
| 2002/0195999 A1 | * | 12/2002 | Kimura et al. | .............. 320/134 |

* cited by examiner

*Primary Examiner*—Patrick Assouad
(74) *Attorney, Agent, or Firm*—Morgan Lewis & Bockius LLP

(57) ABSTRACT

A method for determining an effective voltage of a battery includes detecting a battery voltage at a predetermined interval, and counting a number of times the battery voltage is detected within a series of predetermined voltage ranges. The method also includes calculating a ratio of the change of the counted number with respect to a change of the battery voltage, and determining a first peak point of the calculated ratio.

10 Claims, 6 Drawing Sheets

METHOD FOR DETERMINING AN EFFECTIVE VOLTAGE OF A BATTERY

FIELD OF THE INVENTION

The present invention relates to a hybrid electric vehicle, and more particularly, to a method for determining the point at which a capacitive component of a battery disappears during charging or discharging, thereby determining a more accurate effective voltage of the battery.

BACKGROUND OF THE INVENTION

Generally, a hybrid electric vehicle includes an ETC (Electric Throttle Control) that is applied to a gasoline engine, an electric motor, and a CVT (Continuously Variable Transmission) in order to transmit driving torque to the wheels.

A hybrid electric vehicle can be operated using battery voltage in order to increase fuel economy of the gasoline engine. To generate the battery voltage, kinetic energy of the vehicle is converted to electric energy during a power generation mode, e.g., while braking or decelerating. The battery is charged with the acquired electric energy so that fuel economy can be increased, and to provide power for other vehicle control functions. The battery must be charged to specific voltage levels.

During charging or discharging, the voltage of a battery generally abruptly increases for a short period because of a capacitive component of the battery. Therefore, an instantaneous measurement of the voltage of the battery does not accurately reflect the charge state of the battery while the capacitive component exists. During this time period, exact control of the electric vehicle is difficult.

Capacitive components may not be a problem for low-speed processors for the battery management system, however, because the processor may not detect the voltage of the battery during the existence of the capacitive component. In this case, the battery voltage is detected after the disappearance of the capacitive component. Thus, the acquired voltage (without the capacitive component) reflects the actual charge state of the battery and enables relatively precise control of the battery and the electric vehicle.

However, as the calculation speed of the processor increases, the voltage of the battery is detected even while the capacitive component of the battery exists. Thus, to acquire an accurate effective voltage for a battery, a minimum period of time must pass in order to allow the capacitive component of the battery to disappear. This allows for more stable and more accurate control of the battery and the electric vehicle. In other words, a minimum period of time must pass to allow the abrupt increase of the battery voltage, caused by the capacitive component after charging or discharging, to disappear.

Because the capacitive component of the battery that exists during charging or discharging is not substantial, this voltage cannot be used as a source of power for driving the motor or other voltage-driven function. The capacitive component is not an energy storage component, but rather a component that rapidly responds to a load. The capacitive component acts as a noise component when calculating voltage-dependent values, such as the state of the charge, the current limitation, the available voltage, or the real voltage.

Generally, the capacitive component of the battery can be acquired using the Thevenin equivalent circuit for the battery while the battery is not being charged or discharged. However, modeling of the battery according to this method is not suitable for ascertaining an unloaded voltage, an internal resistance, or a capacitive component. It is much more difficult to estimate the capacitive component of the battery in a hybrid electric vehicle in which charging and discharging occur repeatedly.

SUMMARY OF THE INVENTION

In a preferred embodiment of the present invention, a method for determining the effective voltage of a battery includes detecting a battery voltage at a predetermined interval, and counting the number of times the battery voltage is detected within a series of predetermined voltage ranges. The method also includes calculating a ratio of the change of the counted number with respect to a change of the battery voltage, and then determining a first peak point of the calculated ratio.

Preferably, the method further comprises identifying the first peak point as a point when a capacitive component of the battery disappears. It is also preferable that the first peak point is used as a reference point for power control of a load, and as a reference point for calculating a state of charge or discharge, a voltage limit, or an available voltage, or any combination thereof.

In another preferred embodiment of the present invention, a method for determining an effective battery voltage of a battery includes measuring a battery voltage over time. A first amount of time that the measured battery voltage falls within a first predetermined voltage range is determined. Also, a second amount of time that the measured battery voltage falls within a second predefined voltage range is determined.

The method further includes calculating a first ratio of the difference between the first amount of time and the second amount of time; repeating the determining and calculating steps to calculate other ratios; and determining a first peak point of the calculated first and other ratios.

Preferably, the method includes identifying the first peak point as a point when a capacitive component of the battery disappears. Also, preferably, the first peak point is used as a reference point for power control of a load, and also used as a reference point for calculating a state of charge or discharge, a voltage limit, or an available voltage, or any combination thereof.

In yet another preferred embodiment of the present invention, a system for determining an effective voltage of a battery includes a motor control unit, a battery management system, and a hybrid control unit. The motor control unit outputs motor torque control commands, and the hybrid control unit controls at least one of the motor control unit and the battery management system through control commands. The battery management system manages the charging state of the battery.

Preferably, the battery management system includes: logic for detecting a battery voltage at a predefined interval; logic for counting the number of times the battery voltage is detected within a series of predetermined voltage ranges; logic for calculating a ratio of the change of the counted number with respect to a change of the battery voltage; and, logic for determining a first peak point of the calculated ratio.

Also, preferably, the motor control unit, battery management system, and hybrid control unit comprise part of a hybrid electric vehicle. The hybrid control unit directs the motor control unit to regenerate the battery voltage, as managed by the battery management system, when the hybrid electric vehicle is decelerating.

BRIEF DESCRIPTION OF THE DRAWINGS

The accompanying drawings, which are incorporated in and constitute a part of the specification, illustrate an embodiment of the invention, and, together with the description, serve to explain the principles of the invention, where.

DETAILED DESCRIPTION OF THE PREFERRED EMBODIMENTS

Hereinafter, preferred embodiments of the present invention will be described in detail with reference to the accompanying drawings.

Figure 1:
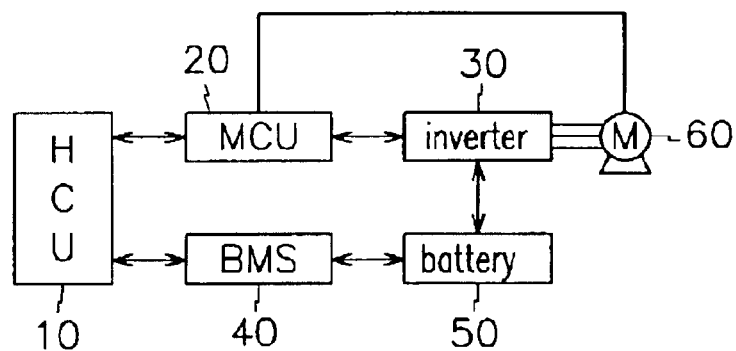
FIG. 1 is a block diagram of a battery management system of a hybrid electric vehicle, in accordance with one embodiment of the present invention.

As shown in FIG. 1, a power control system for a hybrid electric vehicle includes a hybrid control unit 10 (hereinafter referred to as an HCU), a motor control unit 20 (hereinafter referred to as an MCU), an inverter 30, and a battery management system 40 (hereinafter referred to as a BMS). The HCU, MCU, and BMS may each include a processor, memory, other hardware components, and software modules that can be used to program the processor and other pertinent hardware components. In other embodiments, the HCU, MCU, and BMS may not each contain all of these components, but may instead utilize shared functionality through communications over one or more system busses. Each control unit may also utilize a greater number of inputs and/or outputs than shown in FIG. 1.

The HCU 40 controls various control units of the hybrid electric vehicle. The MCU 20 outputs motor torque control commands based on a control signal of the HCU 10, such that, e.g., motor 60 regenerates power for battery 50 during deceleration. This ensures that the battery maintains a proper charging state.

The inverter 30 is used to convert DC power to AC power in a startup mode, and AC power to DC power in a power generation mode. The inverter 30 transmits the power of the battery to the motor 60 by operating an IGBT switch through pulse width modulation (PWM), under control of the MCU 20.

The BMS 40 manages the charging state of the battery based on current, voltage, temperature, etc.

A method for determining an effective voltage of a battery in accordance with a preferred embodiment, which can be applied to the system detailed above, will now be explained.

As discussed previously, if the battery 50 is charged by regeneration energy generated during deceleration of the hybrid electric vehicle, or by operation of an internal combustion engine, the voltage of the battery rapidly increases for a short period just after charging of the battery starts, due to a capacitive component of the battery. This rapid increase of the voltage of the battery also occurs during discharging of electricity from the battery, making the methods of the present invention equally applicable to battery discharging. Thus, the example of the present invention described below, while explained in a battery-charging context, is equally applicable to battery discharging.

Figure 2:
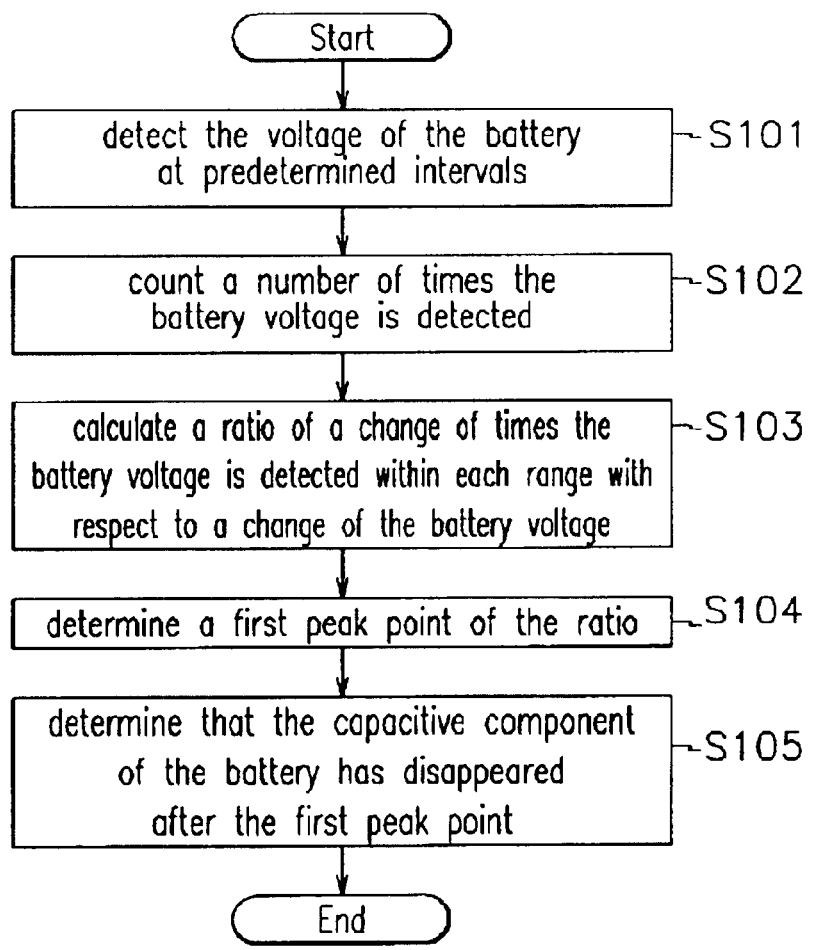
FIG. 2 is a flowchart showing a battery management method of the hybrid electric vehicle according to one embodiment of the present invention.

Referring to FIG. 2, the BMS 40 detects the voltage of the battery 50 at predetermined intervals (step S101), and then counts the number of times the battery voltage is detected within a series of predetermined voltage ranges (step S102). The predetermined intervals can be, e.g., 0.001 second, 0.0001 second, etc., and the predetermined voltage ranges can be, e.g., 8.315 V–8.325 V, 8.325 V–8.335 V, etc. Also, each voltage range can be represented by a voltage within the range (e.g., 8.335 V). For purposes of this specification, voltage ranges will be referred to by a representative voltage within each range.

Next, BMS 40 calculates the ratio of the change in the number of times the battery voltage is counted within each range, to a change of the battery voltage (step S103). A first peak point of the calculated ratio is then determined (step S104). From this first peak point, the BMS 40 can identify when the capacitive component of the battery 50 has disappeared (step S105). The BMS 40 provides the voltage after the first peak point to other control systems for calculating the state of charge, a current limit for the load, or an available voltage for providing to the load. In this manner, the first peak can be used as a reference point for power control of a load.

Figure 3:
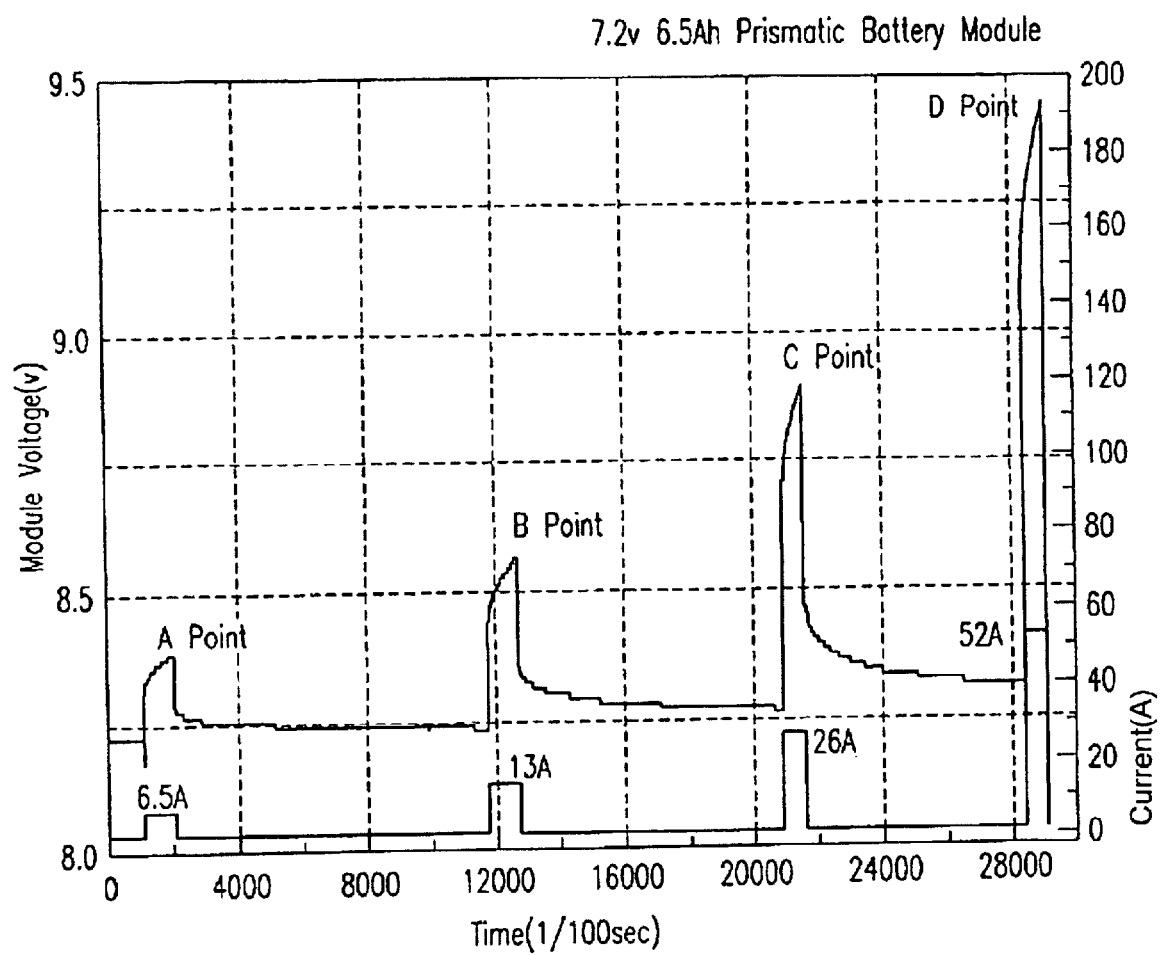
FIG. 3 is a graph showing a plot of voltage versus current for a battery during charging of the battery.
Figure 4:
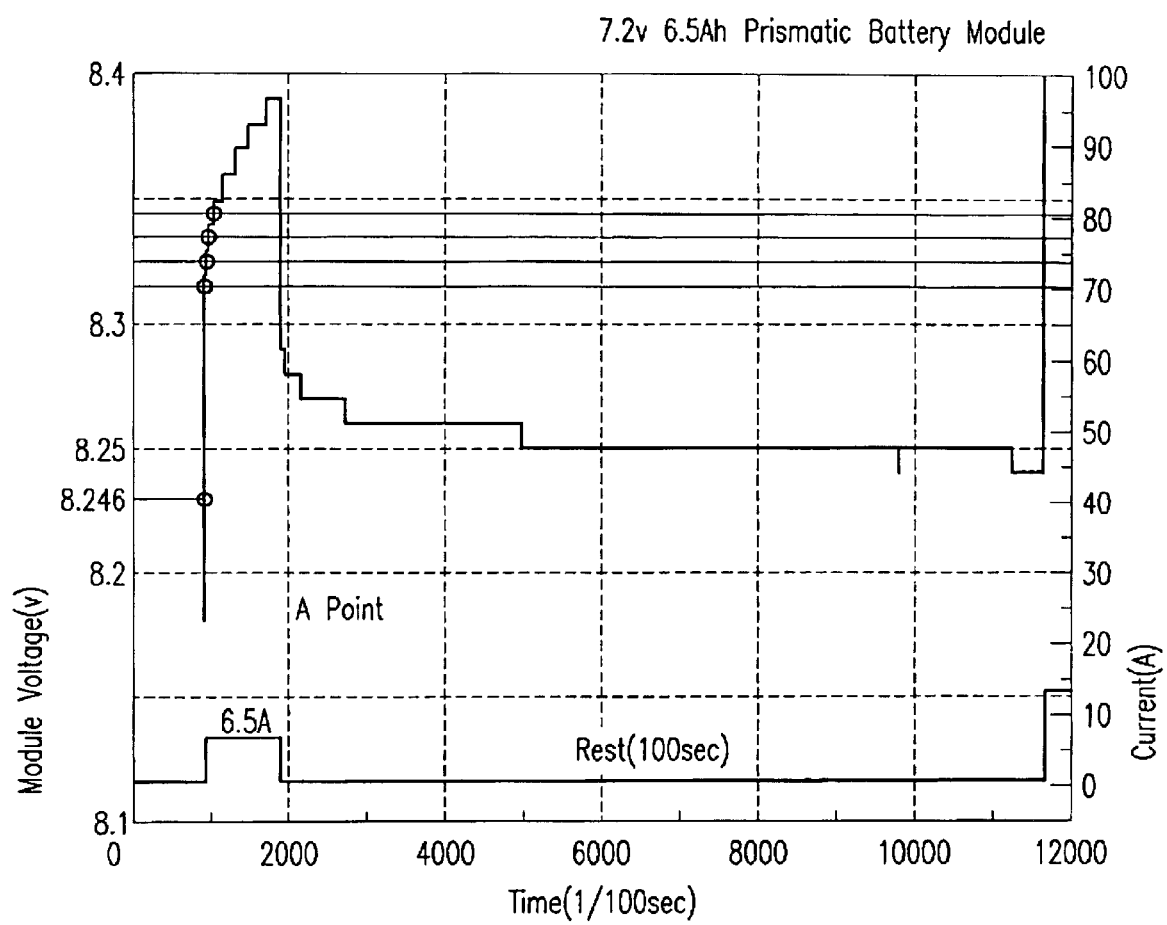
FIG. 4 is an expanded view of region A from FIG. 3.

As shown in FIGS. 3 and 4, if a 7.2V/6.5 Ah battery module is charged at various current levels, the charging voltages rapidly increase for a short period just after charging is started. The amounts of the voltage increase vary according to the charging current levels.

For example, in FIG. 3, region A shows the voltage behavior when the battery is charged with a 6.5 A current; region B shows the voltage behavior when the battery is charged with a 13 A current; region C shows the voltage behavior when the battery is charged with a 26 A current; and region D shows the voltage behavior when the battery is charged with a 52 A current. As shown in the graph, as the charging current increases, the amount of the voltage increase becomes larger, and the period of the disappearance of the capacitive component of the battery becomes smaller.

Figure 5:
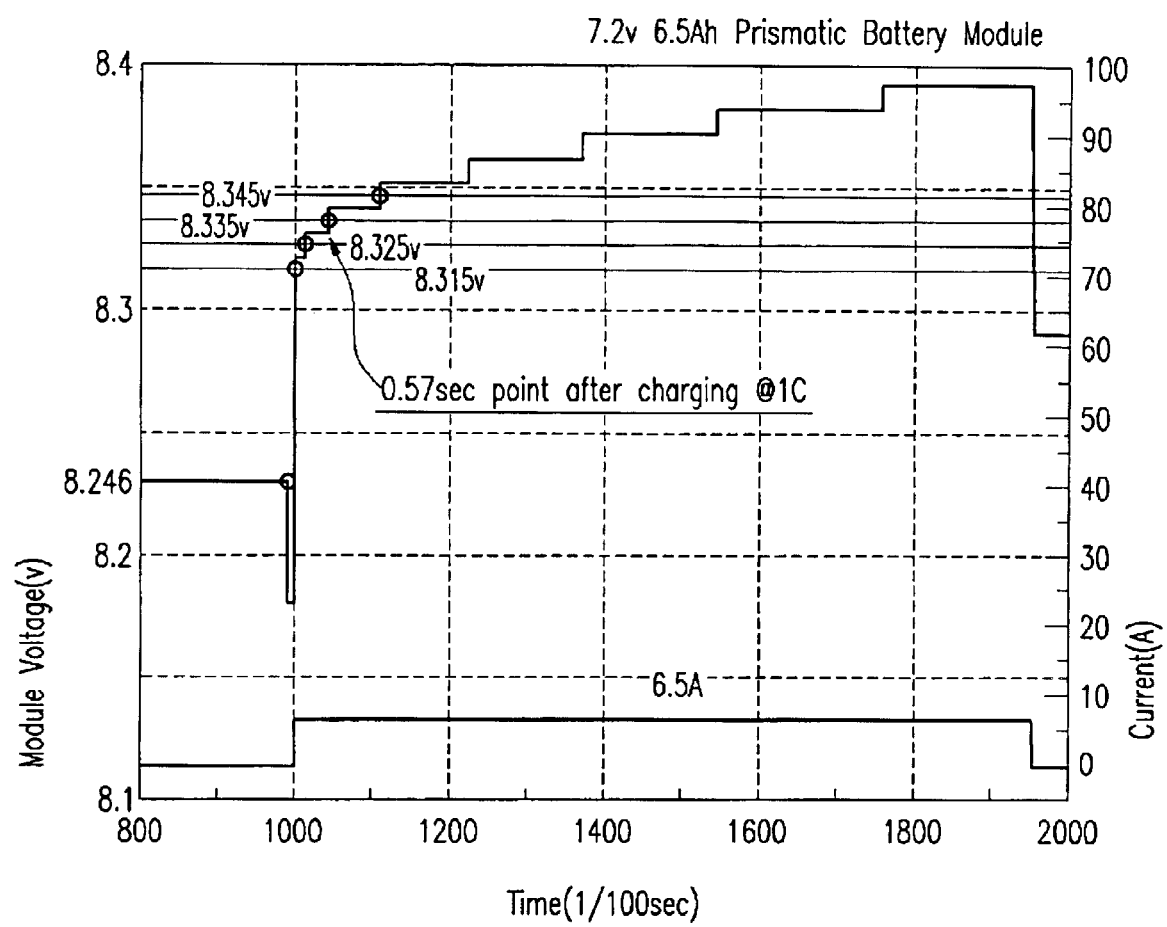
FIG. 5 is an expanded view of region A from FIG. 4.

Thus, as shown in FIG. 5 (an expanded view of region A in FIGS. 3 and 4), if the battery is charged at a voltage of 8.246V, the actual voltage of the battery rapidly increases to a point of 8.315V because of the capacitive component of the battery, and then gradually further increases to 8.325V, 8.335V, and 8.345V.

Figure 6:
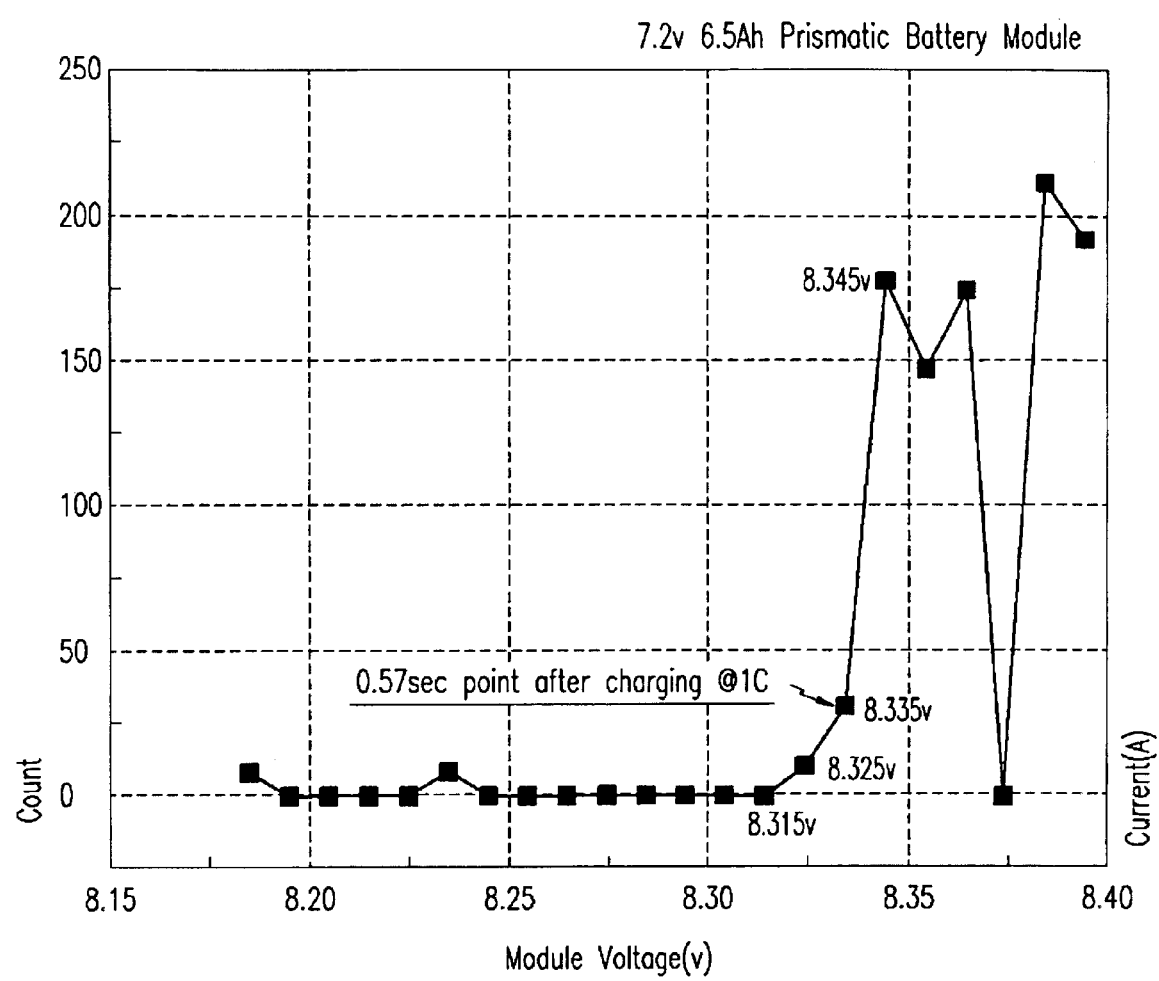
FIG. 6 is a graph depicting a count of the number of times predefined voltages were measured in the charging voltages of FIG. 5, in accordance with an embodiment of the present invention.

In accordance with one embodiment of the present invention, BMS 40 counts the number of times the battery voltage is detected within predetermined voltage ranges for FIG. 5. The results are shown in FIG. 6. For example, the counted number at 8.315V is 0, and the counted number at 8.325V is about 5. After 0.57 seconds from the starting of the charge, the voltage of the battery reaches 8.335V, and the counted number is about 27. The counted number at 8.345V is about 180.

In other embodiments, the number of times the battery voltage is detected within predetermined voltage ranges is not explicitly counted—instead, the amount of time that the battery voltage remains within each predetermined voltage range is determined.

Figure 7:
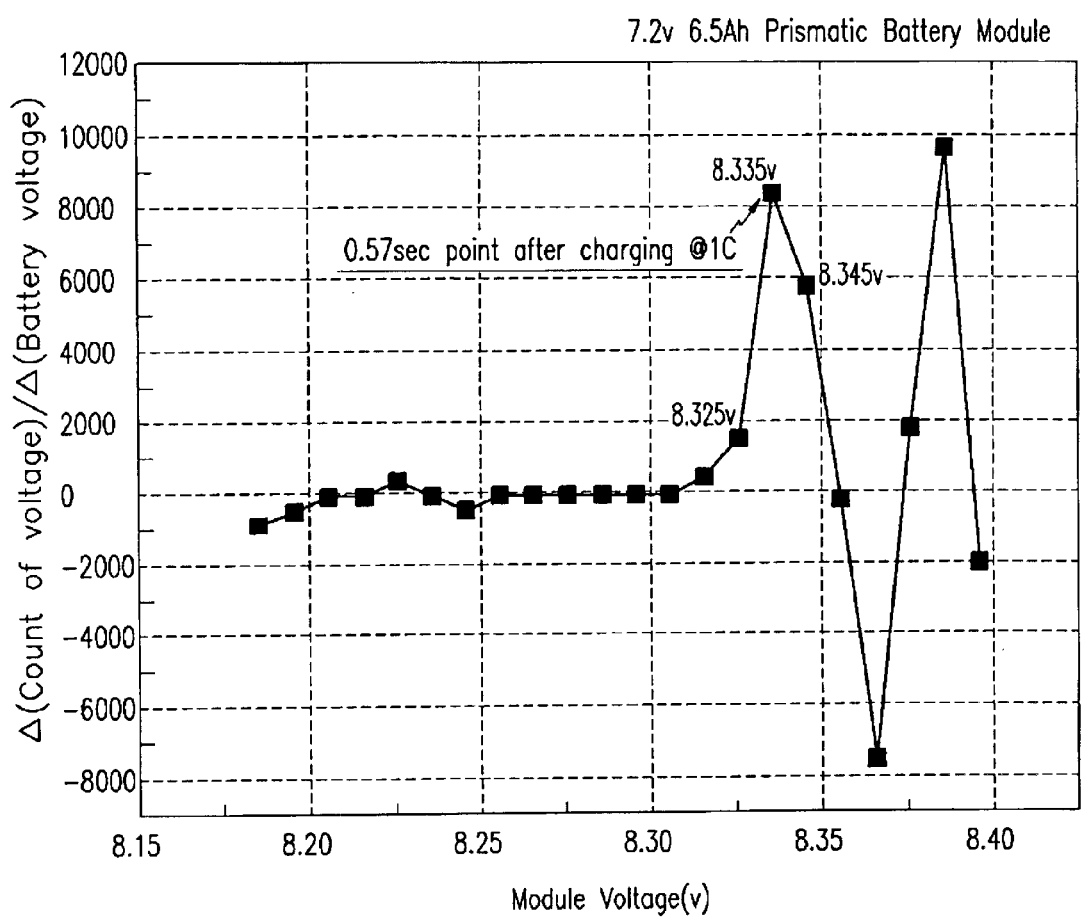
FIG. 7 is a graph depicting a ratio of the change in the count of the predefined voltages of FIG. 6, with respect to a change of the measured voltage, in accordance with the embodiment.

As shown in FIG. 7, the ratio of the change of the counted numbers (from FIG. 6) with respect to a change of the battery voltage is calculated, in accordance with one embodiment of the present invention. FIG. 7 depicts the results of these calculations. These ratios reflect, e.g., large changes in the count of voltages within a predetermined voltage range, relative to the preceding count of voltages within the preceding predefined voltage range. From these calculated ratios, a first peak point can be determined. In FIG. 7, the first peak is at 8.335V. This point corresponds to an inflection point of the curve of the counted number of voltages of FIG. 6.

In an alternative embodiment that does not explicitly count the number of battery voltages within predetermined voltage ranges, but instead uses the amount of time that the battery voltage falls within each range, the calculated ratios are based on the difference between the amount of time the battery voltage falls within successive predetermined voltage ranges.

The inventors have determined that after this first peak, the capacitive component of a battery substantially disappears. Thus, BMS 40 detects the voltage of the battery after this peak for calculating the state of charge of the battery, a current limit for the load, or an available voltage for providing to the load. By determining the point at which the capacitive component of the battery disappears during charging or discharging, controls that are based on the battery voltage become more reliable and accurate.

Although preferred embodiments of the present invention have been described in detail hereinabove, it should be clearly understood that many variations and/or modifications of the basic inventive concepts herein taught which may appear to those skilled in the present art will still fall within the sprit and scope of the present invention, as defined in the appended claims.

What is claimed is:

1. A method for determining an effective battery voltage of a battery, comprising:
   detecting a battery voltage at a predetermined interval;
   counting a number of times the battery voltage is detected within a series of predetermined voltage ranges;
   calculating a ratio of a change of the counted number with respect to a change of the battery voltage; and
   determining a first peak point of the calculated ratio.

2. The method of claim 1, further comprising
   identifying the first peak point as a point when a capacitive component of the battery disappears.

3. The method of claim 1, wherein the first peak point is used as a reference point for power control of a load.

4. The method of claim 1, wherein the first peak point is used as a reference point for calculating a state of charge or discharge, a voltage limit, or an available voltage.

5. A method for determining an effective battery voltage of a battery, comprising:
   measuring a battery voltage over time;
   determining a first amount of time that the measured battery voltage falls within a first predetermined voltage range, and a second amount of time that the measured battery voltage falls within a second predefined voltage range;
   calculating a first ratio of the difference between the first amount of time and the second amount of time;
   repeating the determining and calculating steps to calculate other ratios; and
   determining a first peak point of the calculated first and other ratios.

6. The method of claim 5, further comprising
   identifying the first peak point as a point when a capacitive component of the battery disappears.

7. The method of claim 5, wherein the first peak point is used as a reference point for power control of a load.

8. The method of claim 5, wherein the first peak point is used as a reference point for calculating a state of charge or discharge, a voltage limit, or an available voltage.

9. A system for determining an effective voltage of a battery, the system comprising:
   a motor control unit to output motor torque control commands;
   a battery management system to manage the charging state of the battery, the battery management system comprising:
      logic for detecting a battery voltage at a predetermined interval;
      logic for counting a number of times the battery voltage is detected within a series of predetermined voltage ranges;
      logic for calculating a ratio of a change of the counted number with respect to a change of the battery voltage; and
      logic for determining a first peak point of the calculated ratio; and
   a hybrid control unit to control at least one of the motor control unit and the battery management system through control commands.

10. The system of claim 9, wherein the motor control unit, battery management system, and hybrid control unit comprise part of a hybrid electric vehicle, and further wherein the hybrid control unit directs the motor control unit to regenerate the battery voltage, as managed by the battery management system, when the hybrid electric vehicle is decelerating.

* * * * *